(12) United States Patent
Kutsumizu

(10) Patent No.: US 11,578,246 B2
(45) Date of Patent: Feb. 14, 2023

(54) ANISOTROPIC GRAPHITE AND ANISOTROPIC GRAPHITE COMPOSITE

(71) Applicant: KANEKA CORPORATION, Osaka (JP)

(72) Inventor: Makoto Kutsumizu, Osaka (JP)

(73) Assignee: KANEKA CORPORATION, Osaka (JP)

( * ) Notice: Subject to any disclaimer, the term of this patent is extended or adjusted under 35 U.S.C. 154(b) by 175 days.

(21) Appl. No.: 17/279,870

(22) PCT Filed: Sep. 11, 2019

(86) PCT No.: PCT/JP2019/035756
§ 371 (c)(1),
(2) Date: Mar. 25, 2021

(87) PCT Pub. No.: WO2020/066634
PCT Pub. Date: Apr. 2, 2020

(65) Prior Publication Data
US 2021/0395593 A1 Dec. 23, 2021

(30) Foreign Application Priority Data
Sep. 27, 2018 (JP) .............................. JP2018-182418

(51) Int. Cl.
*B32B 9/00* (2006.01)
*C09K 5/14* (2006.01)
(Continued)

(52) U.S. Cl.
CPC .................. *C09K 5/14* (2013.01); *B32B 3/30* (2013.01); *B32B 7/12* (2013.01); *B32B 9/007* (2013.01);
(Continued)

(58) Field of Classification Search
None
See application file for complete search history.

(56) References Cited

U.S. PATENT DOCUMENTS

| 4,070,514 A * | 1/1978 | Eatherly | ............... C04B 38/063 |
| | | | 264/44 |
| 2006/0035085 A1* | 2/2006 | Ozaki | ............... C04B 35/63468 |
| | | | 428/408 |
| 2015/0190982 A1* | 7/2015 | Kutsumizu | ......... H01L 23/3735 |
| | | | 428/140 |

FOREIGN PATENT DOCUMENTS

JP          2012238733 A          12/2012

OTHER PUBLICATIONS

International Search Report issued for PCT/JP2019/035756, dated Nov. 19, 2019 (2 pages).

(Continued)

*Primary Examiner* — Seth Dumbris
(74) *Attorney, Agent, or Firm* — Osha Bergman Watanabe & Burton LLP

(57) ABSTRACT

Provided is anisotropic graphite for producing an anisotropic graphite composite having excellent thermal conduction property and excellent long-term reliability as a heat dissipating member. Given an X axis, a Y axis orthogonal to the X axis, and a Z axis perpendicular to a plane defined by the X axis and the Y axis, and a crystal orientation plane of the anisotropic graphite is parallel to an X-Z plane, and a specific number of holes each having a specific size are formed in at least one surface out of surfaces of the anisotropic graphite which are parallel to an X-Y plane.

7 Claims, 2 Drawing Sheets

(51) Int. Cl.
  *C01B 32/21*    (2017.01)
  *B32B 3/30*     (2006.01)
  *B32B 7/12*     (2006.01)
  *B32B 9/04*     (2006.01)
  *B32B 15/04*    (2006.01)
  *B32B 15/20*    (2006.01)
  *H01L 23/373*   (2006.01)

(52) U.S. Cl.
  CPC ............ *B32B 9/041* (2013.01); *B32B 15/043* (2013.01); *B32B 15/20* (2013.01); *C01B 32/21* (2017.08); *B32B 2307/302* (2013.01); *B32B 2457/14* (2013.01); *C01P 2006/32* (2013.01); *H01L 23/373* (2013.01); *Y10T 428/30* (2015.01)

(56) References Cited

OTHER PUBLICATIONS

International Preliminary Report on Patentability issued for PCT/2019/035756, dated Mar. 23, 2021 (6 pages).

\* cited by examiner

ANISOTROPIC GRAPHITE AND ANISOTROPIC GRAPHITE COMPOSITE

TECHNICAL FIELD

One or more embodiments of the present invention relate to anisotropic graphite and an anisotropic graphite composite.

BACKGROUND

Anisotropic graphite has a high thermal conductivity in the direction parallel to a crystal orientation plane of graphite and a low thermal conductivity in the direction perpendicular to the graphite crystal orientation plane. Known examples of anisotropic graphite include a graphite stack.

Anisotropic graphite, due to its excellent thermal conductance, is used, in a semiconductor package, as a material for effectively transferring heat generated by a semiconductor element, which is located in an upper part of the semiconductor package, to a cooler and dissipating the heat, to prevent concentration of the heat in the semiconductor package.

For example, known is an anisotropic graphite composite in which anisotropic graphite and an inorganic material layer are joined together. Here, the anisotropic graphite and the inorganic material layer can be joined by a method of using, as a joining material, an active metal brazing material containing titanium. For example, Patent Literature 1 discloses an anisotropic heat conductive element obtained by joining a plate-shaped graphite structure and a copper plate together via an insert material containing titanium under pressure.

PATENT LITERATURE

Patent Literature 1
Japanese Patent Application Publication Tokukai No. 2012-238733

The inventor of the present application found, on her own, that the related art as described above results in insufficient joining between anisotropic graphite, which has low surface activity, and a titanium-containing metal layer and may fail to exhibit long-term reliability.

SUMMARY

An aspect of one or more embodiments of the present invention is to provide anisotropic graphite for producing an anisotropic graphite composite having excellent thermal conduction property and excellent long-term reliability as a heat dissipating member.

The present inventor studied diligently and completed one or more embodiments of the present invention by finding that forming, in anisotropic graphite, a specific number of holes each having a specific size improves adhesion between the anisotropic graphite and a joining material due to the anchor effect, and thus enables excellent thermal conduction property and excellent long-term reliability required for a heat dissipating member. One or more embodiments of the present invention include the following.

Anisotropic graphite having, given an X axis, a Y axis orthogonal to the X axis, and a Z axis perpendicular to a plane defined by the X axis and the Y axis, a crystal orientation plane parallel to a plane defined by the X axis and the Z axis, wherein, out of surfaces of the anisotropic graphite which are parallel to the plane (X-Y plane) defined by the X axis and the Y axis, at least one surface has more than 1000 holes per square millimeter formed therein, the holes each having a diameter of not less than 0.1 μm and less than 20 μm and a depth of not less than 1 μm.

An aspect of one or more embodiments of the present invention provides anisotropic graphite for producing an anisotropic graphite composite having excellent thermal conduction property and excellent long-term reliability.

DETAILED DESCRIPTION OF THE EMBODIMENTS

Figure 1:
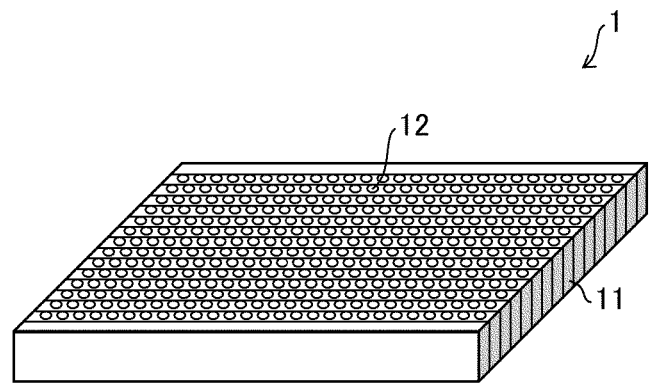
FIG. 1 is a perspective view of anisotropic graphite in accordance with embodiments of the present invention.
Figure 1:
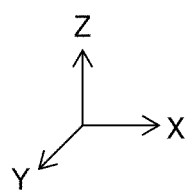

The following description will discuss embodiments of the present invention. One or more embodiments of the present invention are not, however, limited to these embodiments. Embodiments of the present invention are not limited to the configurations described below, but may be altered within the scope of the claims. One or more embodiments of the present invention also encompass, in its technical scope, any embodiments and examples derived by combining technical means disclosed in differing embodiments and Examples. Further, it is possible to form a new technical feature by combining the technical means disclosed in the respective embodiments. All academic and patent literatures listed herein are incorporated herein by reference. Any numerical range expressed as "A to B" as used herein means "not less than A and not more than B" unless otherwise specified.

1. Anisotropic Graphite

Anisotropic graphite in accordance with one or more embodiments of the present invention is such that, given an X axis, a Y axis orthogonal to the X axis, and a Z axis perpendicular to a plane defined by the X axis and the Y axis, a crystal orientation plane of the anisotropic graphite is parallel to a plane defined by the X axis and the Z axis, wherein, out of surfaces of the anisotropic graphite which are parallel to the plane (X-Y plane) defined by the X axis and the Y axis, at least one surface has more than 1000 holes per square millimeter formed therein, the holes each having a diameter of not less than 0.1 μm and less than 20 μm and a depth of not less than 1 μm. This configuration enables the provision of an anisotropic graphite composite having excellent thermal conduction property and excellent long-term reliability. An example method of producing an anisotropic graphite composite includes stacking a titanium-containing metal layer (described later) as a joining material on the surface of anisotropic graphite which has holes formed therein and then subjecting the resultant stack to heating, pressing, or other process. In this case, the joining material enters the holes of the anisotropic graphite, thus improving the adhesion between the anisotropic graphite and the joining material due to the anchor effect. Consequently, it is inferred that the improvement of the adhesion, in turn, leads to improvement of the thermal conduction property and long-term reliability of the anisotropic graphite composite. It should be noted that "the X axis, the Y axis, and the Z axis" used herein refer to those illustrated in FIG. 1.

The anisotropic graphite has a block-like form including a plurality of stacked layers, each having a graphene structure in which six-membered rings are linked by covalent bonds. The block-like anisotropic graphite has high thermal conductance in the direction parallel to the crystal orientation plane of the graphene structure. The word "anisotropic" of "anisotropic graphite" refers to the fact that, because the graphite layers have orientations, there is a significant difference between the thermal conductance in the direction parallel to the crystal orientation plane and the thermal conductance in the direction perpendicular to the crystal orientation plane.

Given the X axis, the Y axis orthogonal to the X axis, and the Z axis perpendicular to the plane defined by the X and Y axes illustrated in FIG. 1, the crystal orientation plane of anisotropic graphite is parallel to the plane defined by the X and Z axes. As described above, anisotropic graphite has excellent thermal conductance in the direction parallel to the crystal orientation plane. Since the crystal orientation plane of the anisotropic graphite is parallel to the plane defined by the X and Z axes, heat is allowed to dissipate in the thickness direction of the anisotropic graphite.

The three-dimensional shape of the anisotropic graphite is not particularly limited, provided that the crystal orientation plane of the anisotropic graphite is parallel to the plane defined by the X and Z axes. The shapes of side surfaces of the anisotropic graphite include, for example, a square, a rectangle, a trapezoid, and a stepped form. In terms of exhibiting an excellent thermal conductivity, the three-dimensional shape of the anisotropic graphite may be a rectangular parallelepiped.

The anisotropic graphite in accordance with one or more embodiments of the present invention may have a length of a side parallel to the X axis of not shorter than 4 mm and not longer than 300 mm, not shorter than 10 mm and not longer than 100 mm, or not shorter than 20 mm and not longer than 80 mm. The anisotropic graphite may have a length of a side parallel to the Y axis of not shorter than 4 mm and not longer than 300 mm, not shorter than 10 mm and not longer than 100 mm, or not shorter than 15 mm and not longer than 50 mm. The thickness in the direction along the Z axis may be not shorter than 0.5 mm and not longer than 5.0 mm, not shorter than 1.0 mm and not longer than 3.5 mm, or not shorter than 1.2 mm and not longer than 2.5 mm.

The anisotropic graphite is not limited to a particular type of anisotropic graphite, provided that it has high thermal conductance along the crystal orientation plane. Examples which can be used as the anisotropic graphite include anisotropic graphite produced by polymer decomposition, pyrolytic anisotropic graphite, extrusion molded anisotropic graphite, and molded anisotropic graphite. In particular, the anisotropic graphite may be the anisotropic graphite produced by polymer decomposition or the pyrolytic anisotropic graphite. The anisotropic graphite produced by polymer decomposition and the pyrolytic anisotropic graphite have a high thermal conductivity along the crystal orientation plane of the graphene structure that is not less than 1500 W/mK. Accordingly, anisotropic graphite composites obtained from these kinds of anisotropic graphite have excellent heat transmission property.

1-1. Formation of Holes

The anisotropic graphite in accordance with one or more embodiments of the present invention has holes formed in at least one of the surfaces parallel to the X-Y plane. For example, as illustrated in FIG. 1, holes 12 are formed in the surface perpendicular to the crystal orientation plane of anisotropic graphite 1, which is a rectangular parallelepiped, i.e., the surface parallel to the X-Y plane. The structure of the anisotropic graphite 1 has a structure in which graphite layers 11 parallel to the X-Z plane are stacked. The anisotropic graphite 1 has two upper and lower surfaces as the surfaces parallel to the X-Y plane. Holes may be formed in either one or both of the two surfaces. In addition, each hole may be formed so as to be perpendicular to the X-Y plane, i.e., so as to be parallel to the X-Z plane.

The diameter of each hole may be not smaller than 0.1 μm, not smaller than 2 μm, or not smaller than 5 μm. Anisotropic graphite with the holes having a diameter of not smaller than 0.1 μm is less likely to cause displacement of a joining material stacked on the anisotropic graphite and thus has excellent long-term reliability. Further, the diameter of each hole may be smaller than 20 μm, not larger than 10 μm, or not larger than 5 μm. Anisotropic graphite with the holes having a diameter of smaller than 20 μm is continuous in its large region, and thus has excellent thermal conduction property.

The depth of each hole may be not smaller than 5 μm, not smaller than 10 μm, not smaller than 100 μm, or not smaller than 1 mm. Anisotropic graphite with the holes having a depth of not smaller than 5 μm is less likely to cause displacement of a joining material stacked on the anisotropic graphite and thus has excellent long-term reliability.

The number of holes per unit area may be more than 1000 per square millimeter (mm$^2$), not less than 2000 per square millimeter, not less than 4000 per square millimeter, or not less than 5000 per square millimeter. Anisotropic graphite with the holes the number of which per unit area is more than 1000 per square millimeter is less likely to cause displacement of a joining material stacked on the anisotropic graphite and thus has excellent long-term reliability. It should be noted that the number of holes per unit area is also referred to simply as "the number of holes" in this specification.

In this specification, an average diameter and an average depth determined by measuring the sizes of a plurality of any given holes, obtaining the largest diameters and largest depths of the respective holes, and taking the averages for the obtained diameters and depths are referred to as "hole diameter" and "hole depth", respectively. The holes subjected to the measurement are those that can be observed in a cross-sectional SEM image of the anisotropic graphite at a 1000× magnification (within approximately 70 μm×80 μm). The number of holes can be also measured using a cross-sectional SEM image of any region of the anisotropic graphite at a 1000× magnification.

The holes of the anisotropic graphite in accordance with one or more embodiments of the present invention may be through holes. Such a configuration achieves further improvement in adhesion between a joining material and the anisotropic graphite. The through holes as used herein refer to holes penetrating the anisotropic graphite having surfaces that are parallel to the X-Y plane from one surface to another. For example, in a case where the anisotropic graphite has two surfaces parallel to the X-Y plane as illustrated in FIG. 1, holes may be formed so as to penetrate the two surfaces.

1-2. Method of Producing Anisotropic Graphite

Anisotropic graphite can be produced by cutting, in a predetermined shape, a graphite block with a graphene structure having six-membered rings of carbon atoms linked by covalent bonds. The graphene structure has high thermal conductance in a planar direction thereof.

Examples of a first method of producing the graphite block includes a method of introducing carbonaceous gas such as methane into a furnace and heating the gas to approximately 2000° C. with a heater to form fine carbon cores. The formed carbon cores are deposited in layers on a substrate, thereby forming a pyrolytic graphite block. Optionally, heat-treating the resultant pyrolytic graphite block to not lower than 2800° C. can yield better orientation of the resultant graphite block.

Examples of a second method of producing the graphite block includes a method of stacking, in layers, polymeric films such as films made of polyimide resin and then heat-treating the resulting stack while applying pressure to the stack by pressing. Specifically, first, polymeric films, which is a starting material, are stacked in layers to form a stack of polymeric films, and the stack is carbonized by pre-heating to a temperature of approximately 1000° C. under reduced pressure or in an inert gas to form a carbonized block. The carbonized block is then graphitized by heating the carbonized block to a temperature of not lower than 2800° C. in a heat treatment in an atmosphere of inert gas while applying pressure by pressing. This enables the formation of a good graphite crystal structure, and thus produces a graphite block having excellent thermal conductance. Alternatively, such an excellent graphite block can be obtained by firing polyimide films one by one to form carbonized films, stacking the resultant carbonized films in layers, and heating the stack of carbonized films to not less than 2800° C.

It should be noted that, in stacking the polymeric films in layers, the polymeric films may be stacked such that the crystal orientation planes of all of the polymeric films are aligned uniformly or may be stacked such that the crystal orientation planes of some of the polymeric films are shifted 90 degrees from those of the other polymeric films.

A method of cutting graphite block can be selected as appropriate from known techniques such as diamond cutting, wire sawing, and machining. In terms of easiness of processing the graphite block into the shape of a substantially rectangular parallelepiped, the method of cutting may be wire sawing among those cutting techniques.

In addition, the cut graphite block may be subjected to surface polishing or roughing. A method of surface polishing or roughing can be selected as appropriate from known techniques such as filing, buffing, and blast treatment.

Examples of a method of forming the holes include, but are not particularly limited, the following methods (i) and (ii): (i) a method of, after obtaining anisotropic graphite by the above method, forming holes in at least one of the surfaces of the anisotropic graphite that are parallel to the X-Y plane; and (ii) a method of forming grooves in the surfaces of polyimide films, stacking the polyimide films, and then heating the films in heat treatment to obtain anisotropic graphite (the resultant anisotropic graphite has formed therein holes originating in the grooves).

In the above method (i), the holes can be formed in the surfaces of the anisotropic graphite that are parallel to the X-Y plane by, for example, drilling, laser processing, electric discharge machining, grooving with needles or the like, embossing, sandblasting, or filing.

In the above method (ii), the grooves can be formed in the polyimide films by, for example, laser processing, electric discharge machining, grooving with needles or the like, embossing, sandblasting, or filing.

[2. Anisotropic Graphite Composite]

The anisotropic graphite composite in accordance with one or more embodiments of the present invention includes the above-described anisotropic graphite, a titanium-containing metal layer, and an inorganic material layer, wherein the inorganic material layer is joined, via the titanium-containing metal layer, to at least one of the surfaces of the anisotropic graphite that are parallel to the X-Y plane.

Figure 2:
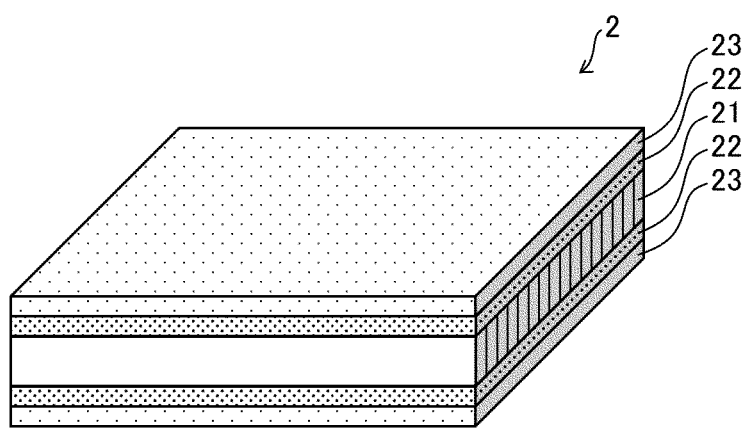
FIG. 2 is a perspective view of an anisotropic graphite composite in accordance with embodiments of the present invention.
Figure 2:
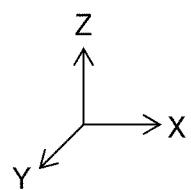

As illustrated in FIG. 2, an anisotropic graphite composite 2 is such that a titanium-containing metal layer 22 and an inorganic material layer 23 are stacked in this order on the surfaces perpendicular to the crystal orientation plane of an anisotropic graphite 21. The anisotropic graphite 21 has specific holes formed therein as described above. This provides good adhesion between the anisotropic graphite 21 and the titanium-containing metal layer 22, and thus enables excellent thermal conduction property and long-term reliability.

2-1. Inorganic Material Layer

In the anisotropic graphite composite in accordance with one or more embodiments of the present invention, an inorganic material layer is joined, via a titanium-containing metal layer, to at least one of the surfaces of anisotropic graphite that are parallel to the X-Y plane. The anisotropic graphite composite including the inorganic material layer is more excellent in strength and heat dissipation than those with anisotropic graphite alone. Further, the inorganic material layer is more likely to be joined to a heat generator such as a semiconductor chip than the anisotropic graphite is.

Examples of the inorganic material layer include a metal layer and a ceramic layer. Heat is relatively less likely to be conducted in the direction perpendicular to the crystal orientation plane of anisotropic graphite (along the Y axis). The thermal conductance of the anisotropic graphite in the Y axis direction can be supplemented by joining the inorganic material layer, which has a relatively high thermal conductivity and is isotropic, to the anisotropic graphite. This makes it possible to exhibit a higher heat dissipating effect is successfully exhibited.

Examples of a metal used as appropriate to form the metal layer include known materials such as gold, silver, copper, nickel, aluminum, molybdenum, tungsten, and alloys containing these metals.

Examples of ceramic used as appropriate to form the ceramic layer include known materials such as alumina, zirconia, silicon carbide, silicon nitride, boron nitride, and aluminum nitride.

In terms of further increasing thermal conductance, the inorganic material layer may be a metal layer, and a metal used to form the metal layer may be copper.

2-2. Titanium-Containing Metal Layer

The anisotropic graphite composite in accordance with one or more embodiments of the present invention includes a titanium-containing metal layer as a joining material used to join the inorganic material layer to the anisotropic graphite. Providing a titanium-containing metal layer between the anisotropic graphite and the inorganic material layer results in very high wettability to the anisotropic graphite and the inorganic material layer. This facilitates favorable atomic diffusion. It is considered that the favorable atomic diffusion provides the resultant anisotropic graphite composite with excellent long-term reliability. Examples of the titanium-containing metal layer include a metal brazing material. The metal brazing material allows for the joint with anisotropic graphite by diffusion. In addition, a metal brazing material, which itself has a relatively high thermal conductivity, enables the resultant anisotropic graphite composite to keep high thermal conductance.

Although the type of the metal brazing material is not particularly limited, the metal brazing material may contain, in addition to titanium, silver and/or copper, or silver. That is, the titanium-containing metal layer may be a titanium-containing silver brazing material.

Although the thickness of the titanium-containing metal layer is not particularly limited, the thickness may be not less than 5 μm and not more than 30 μm, or not less than 8 μm and not more than 17 μm, in terms of having good interfacial adhesion to serve as a joining material and control of increase in thermal resistance.

2-3. Method of Producing Anisotropic Graphite Composite

The anisotropic graphite composite in accordance with one or more embodiments of the present invention can be produced by forming an inorganic material layer and a titanium-containing metal layer on the above-described anisotropic graphite.

Examples of a method of forming the inorganic material layer include plating, spattering, and joining an inorganic material layer plate to anisotropic graphite.

Although the material used to make the titanium-containing metal layer is not particularly limited, it may be plating or a metal brazing material. When plating is used, the titanium-containing metal layer and the inorganic material layer may be integrated into one layer.

To establish joint using a metal brazing material, known materials and techniques can be used. For example, when a titanium-containing silver brazing material is used as a joining material to join the anisotropic graphite and the inorganic material layer, the joint can be achieved through heating at temperatures ranging from 700° C. to 1000° C. for a period of 10 minutes to 1 hour in a vacuum of $1\times10^{-3}$ Pa followed by cooling to normal temperature. Additionally, to obtain a good joint state, the heating may be performed under a load.

One or more embodiments of the present invention can also be configured as follows:

[1] Anisotropic graphite having, given an X axis, a Y axis orthogonal to the X axis, and a Z axis perpendicular to a plane defined by the X axis and the Y axis, a crystal orientation plane parallel to a plane defined by the X axis and the Z axis, wherein, out of surfaces of the anisotropic graphite which are parallel to the plane (X-Y plane) defined by the X axis and the Y axis, at least one surface has more than 1000 holes per square millimeter formed therein, the holes each having a diameter of not less than 0.1 Ξm and less than 20 μm and a depth of not less than 1 μm.

[2] The anisotropic graphite described in [1], wherein the anisotropic graphite has: a length of a side parallel to the X axis of not less than 4 mm and not more than 300 mm; a length of a side parallel to the Y axis of not less than 4 mm and not more than 300 mm; and a thickness in a direction along the Z axis of not less than 0.5 mm and not more than 5.0 mm.

[3] The anisotropic graphite described in [1] or [2], wherein, out of the surfaces of the anisotropic graphite which are parallel to the plane defined by the X axis and the Y axis, the at least one surface has more than 1000 holes per square millimeter formed therein, the holes each having a depth of not less than 1 mm.

[4] The anisotropic graphite described in any one of [1] to [3], wherein the holes are through holes.

[5] The anisotropic graphite described in [1] or [2], wherein, out of the surfaces of the anisotropic graphite which are parallel to the plane defined by the X axis and the Y axis, the at least one surface has not less than 4000 holes per square millimeter formed therein, the holes each having a depth of not less than 1 μm.

[6] The anisotropic graphite described in any one of [1] to [5], wherein, out of the surfaces of the anisotropic graphite which are parallel to the plane defined by the X axis and the Y axis, the at least one surface has more than 1000 holes per square millimeter formed therein, the holes each having a diameter of not less than 2 μm and less than 20 μm.

[7] An anisotropic graphite composite including: an anisotropic graphite described in any one of [1] to [6]; a titanium-containing metal layer; and an inorganic material layer, the inorganic material layer being joined, via the titanium-containing metal layer, to at least one surface out of the surfaces of the anisotropic graphite which are parallel to the plane defined by the X axis and the Y axis.

EXAMPLES

1. Thermal Conduction Property Evaluation Method

Figure 3:
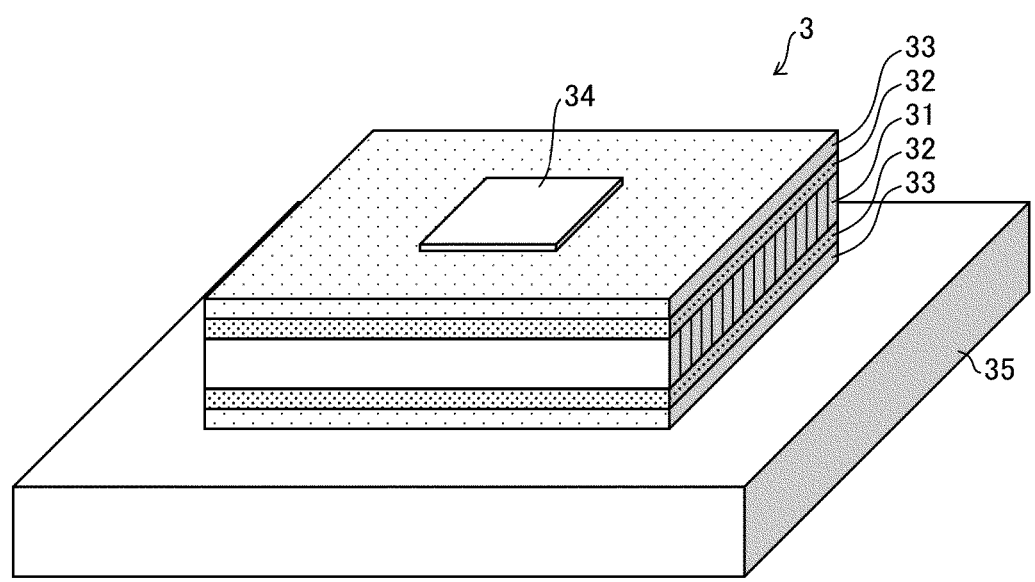
FIG. 3 is a schematic view of a structure for evaluating the anisotropic graphite composite in accordance with Examples of one or more embodiments of the present invention.

An evaluation method will be described with reference to FIG. 3. An anisotropic graphite composite was prepared, which was composed of an anisotropic graphite 31 (20 mm×20 mm in size, 5 mm in thickness), a titanium-containing metal layer 32 (50 μm in thickness), and an inorganic material layer 33 (200 μm in thickness). To the center part of the upper surface of the anisotropic graphite composite, silicone grease (silicone grease manufactured by Shin-Etsu Silicone, model no.: G775) was applied to affix a ceramic heater 34 (micro ceramic heater manufactured by SAKAGUCHI E.H VOC CORP., model no.: MS-M5, size: 5 mm×5 mm). In addition, to the lower surface of the anisotropic graphite composite 3, silicone grease (silicone grease manufactured by Shin-Etsu Silicone, model no.: G775) was applied to affix a water-cooling heat sink 35 (heat sink manufactured by Pepaless Co., Ltd.; model no.: TR-WHS7V1). Water having a temperature of 18° C. was circulated through the water-cooling heat sink 35, and a heat quantity of 10 W was applied to the ceramic heater 34. In this state, a thermal image of the ceramic heater 34 and the upper surface of the anisotropic graphite composite 3 was captured with use of an infrared camera (manufactured by Nippon Avionics Co., Ltd., model no.: InfRec R300SR). The thermal image was analyzed to measure the maximum temperature K1 of the ceramic heater 34 and the minimum temperature K2 of the upper surface of the anisotropic graphite composite. A temperature difference (K1−K2) between K1 and K2 was calculated.

The thermal conduction property was evaluated from the temperature difference (K1−K2) between K1 and K2 as follows: "A": the temperature difference of not more than 4.0° C.; "B": the temperature difference of more than 4.0° C. and not more than 5.0° C.; "C": the temperature difference of more than 5.0° C. and not more than 6.0° C.; and "D": the temperature difference of more than 6.0° C.

2. Long-Term Reliability Evaluation Method

The anisotropic graphite composite 3 was placed in a heat shock tester (manufactured by ESPEC Corp. model no.: TSA-43EL). Heat shock testing was then conducted under the condition where a temperature ranged from −40° C. to 150° C., a steady state time was 5 minutes at −40° C. and 150° C., and the number of cycles was 500.

From the temperature change ($K1_1 - K1_0$), where $K1_0$ is the maximum temperature of the ceramic heater 34 before the heat shock testing, and $K1_1$ is the maximum temperature of the ceramic heater 34 after the heat shock testing, the long-term reliability was evaluated as follows: "A": the temperature change of not more than 2.0° C.; "B": the temperature change of more than 2.0° C. and not more than 3.0° C.; "C": the temperature change of more than 3.0° C. and not more than 4.0° C.; and "D": the temperature change of more than 4.0° C.

Example 1

After 2000 polyimide films (each of which was 50 mm×50 mm in size and 25 μm thick) were stacked, the stack was heated to 2900° C. in a heat treatment in an inert gas atmosphere while being pressed with an applied pressure of 40 kg/cm², so that a graphite block (45 mm×45 mm in size, 23 mm in thickness) was produced.

The thermal conductivity in the direction parallel to the crystal orientation plane was 1500 W/mK and the thermal conductivity in the direction perpendicular to the crystal orientation plane was 5 W/mK.

The resultant graphite block (45 mm×45 mm in size, 23 mm in thickness) was placed such that the crystal orientation planes of the graphite layers of the graphite block were parallel to the X-Z plane. The block was then cut with use of a wire saw, to obtain anisotropic graphite having a 20 mm-long side parallel to the X axis (side a), a 20 mm-long side parallel to the Y axis (side b), and a 5 mm-long side parallel to the Z axis (side c). In the upper and lower surfaces of the resultant anisotropic graphite (two surfaces parallel to the X-Y plane), holes each of which had a diameter of 5 μm and a depth of 5 μm and the number of which was 8000 per square millimeter were formed by pushing a diamond tool having a diameter φ of 5 μm onto the surfaces.

A titanium-based active silver brazing material (20 mm×20 mm in size×50 μm in thickness) serving as a titanium-containing metal layer and oxygen-free copper (20 mm×20 mm in size, 200 μm in thickness) serving as an inorganic material layer were then stacked in this order on each of the upper and lower surfaces of the anisotropic graphite having holes formed therein. The resultant stack was heated at 800° C. for 30 minutes in a vacuum of 1×10⁻³ Pa with a load of 100 kg/ m² applied in the Z-axis direction, so that an anisotropic graphite composite was obtained.

The evaluation results of the thermal conduction property and long-term reliability of the anisotropic graphite composite thus obtained are shown in Table 1.

Example 2

An anisotropic graphite composite was produced by a method similar to that of Example 1, except that the number of holes formed was 6000 per square millimeter. The evaluation results of the thermal conduction property and long-term reliability of the anisotropic graphite composite thus obtained are shown in Table 1.

Example 3

An anisotropic graphite composite was produced by a method similar to that of Example 1, except that the number of holes formed was 3500 per square millimeter. The evaluation results of the thermal conduction property and long-term reliability of the anisotropic graphite composite thus obtained are shown in Table 1.

Example 4

An anisotropic graphite composite was produced by a method similar to that of Example 1, except that the number of holes formed was 2200 per square millimeter. The evaluation results of the thermal conduction property and long-term reliability of the anisotropic graphite composite thus obtained are shown in Table 1.

Example 5

An anisotropic graphite composite was produced by a method similar to that of Example 2, except that holes each having a diameter φ of 0.5 μm were formed with use of a diamond tool having a diameter φ of 0.5 μm. The evaluation results of the thermal conduction property and long-term reliability of the anisotropic graphite composite thus obtained are shown in Table 1.

Example 6

An anisotropic graphite composite was produced by a method similar to that of Example 2, except that holes each having a diameter φ of 2 μm were formed with use of a diamond tool having a diameter φ of 2 μm. The evaluation results of the thermal conduction property and long-term reliability of the anisotropic graphite composite thus obtained are shown in Table 1.

Example 7

An anisotropic graphite composite was produced by a method similar to that of Example 2, except that holes each having a diameter φ of 10 μm were formed with use of a diamond tool having a diameter φ of 10 μm. The evaluation results of the thermal conduction property and long-term reliability of the anisotropic graphite composite thus obtained are shown in Table 1.

Example 8

Polyimide films (each of which was 50 mm×50 mm in size and 25 μm in thickness) were prepared. In the entire surface of each polyimide film, grooves (each of which was 4 μm in width, 2 μm in depth, and 50 mm in length) were formed at a pitch such that 24 grooves are provided per millimeter with use of a diamond tool having a diameter φ of 4.0 μm. After 2000 polyimide films, which were the resultant polyimide films, were stacked, the stack was heated to 2900° C. in a heat treatment in an inert gas atmosphere while being pressed with an applied pressure of 40 kg/cm², so that an anisotropic graphite block (45 mm×45 mm in size, 23 mm in thickness) was produced.

The thermal conductivity in the direction parallel to the crystal orientation plane was 1500 W/mK, and the thermal conductivity in the direction perpendicular to the crystal orientation plane was 5 W/mK.

The resultant graphite block (45 mm×45 mm in size, 23 mm in thickness) was cut with use of a wire saw such that the crystal orientation planes of the graphite layers of the block were parallel to the X-Z plane, to obtain anisotropic graphite having a 20 mm-long side parallel to the X axis (side a), a 20 mm-long side parallel to the Y axis (side b), and a 5 mm-long side parallel to the Z axis (side c). The resultant anisotropic graphite had 2 μm-diameter through holes formed in the X-Z plane. The number of the through holes was 6000 per square millimeter.

A titanium-based active silver brazing material (20 mm×20 mm in size×50 μm in thickness) serving as a titanium-containing metal layer and oxygen-free copper (20 mm×200 μm in size×20 mm in thickness) serving as an inorganic material layer were then stacked in this order on each of the upper and lower surfaces (the surfaces parallel to the X-Z plane) of the anisotropic graphite having holes formed therein. The resultant stack was heated at 800° C. for 30 minutes in a vacuum of $1\times10^{-3}$ Pa with a load of 100 kg/m$^2$ applied in the Z-axis direction, so that an anisotropic graphite composite was obtained.

The evaluation results of the thermal conduction property and long-term reliability of the anisotropic graphite composite thus obtained are shown in Table 1.

Example 9

An anisotropic graphite composite was produced by a method similar to that of Example 8, except that grooves (each of which was 10 μm in width, 4 μm in depth, and 50 mm in length) were formed at a pitch such that 24 grooves are provided per millimeter with use of a diamond tool having a diameter φ of 10 μm. The resultant anisotropic graphite had 5 μm-diameter through holes formed in the X-Z plane. The number of the through holes was 6000 per square millimeter. The evaluation results of the thermal conduction property and long-term reliability of the anisotropic graphite composite thus obtained are shown in Table 1.

Comparative Example 1

An anisotropic graphite composite was produced by a method similar to that of Example 1, except that no holes were formed in the anisotropic graphite. The evaluation results of the thermal conduction property and long-term reliability of the anisotropic graphite composite thus obtained are shown in Table 1.

Comparative Example 2

An anisotropic graphite composite was produced by a method similar to that of Example 1, except that the number of holes formed was 1000 per square millimeter. The evaluation results of the thermal conduction property and long-term reliability of the anisotropic graphite composite thus obtained are shown in Table 1.

Comparative Example 3

An anisotropic graphite composite was produced by a method similar to that of Example 2, except that holes each having a diameter φ of 20 μm were formed with use of a diamond tool having a diameter φ of 20 μm. The evaluation results of the thermal conduction property and long-term reliability of the anisotropic graphite composite thus obtained are shown in Table 1.

TABLE 1

| | Anisotropic Graphite | | | Evaluation Of Anisotropic Graphite Composite | | | |
|---|---|---|---|---|---|---|---|
| | Hole Diameter | Hole Depth | Number Of Holes | Thermal Conduction Property | | Long-Term Reliability | |
| | μm | mm | (holes/mm$^2$) | K1-K2 | Evaluation | K1$_1$-K1$_0$ | Evaluation |
| Example 1 | 5 | 0.005 | 8000 | 4.4 | A | 2.2 | B |
| Example 2 | 5 | 0.005 | 6000 | 4.4 | A | 2.3 | B |
| Example 3 | 5 | 0.005 | 3500 | 4.2 | A | 3.5 | C |
| Example 4 | 5 | 0.005 | 2200 | 4.1 | A | 3.7 | C |
| Comparative Example 1 | — | — | 0 | 4 | A | 5.2 | D |
| Comparative Example 2 | 5 | 0.005 | 1000 | 4.1 | A | 4.5 | D |
| Example 5 | 0.5 | 0.005 | 6000 | 4.1 | A | 3.8 | C |
| Example 6 | 2 | 0.005 | 6000 | 4.1 | A | 2.4 | B |
| Example 2 | 5 | 0.005 | 6000 | 4.4 | A | 2.3 | B |
| Example 7 | 10 | 0.005 | 6000 | 5.6 | B | 2.1 | B |
| Comparative Example 3 | 20 | 0.005 | 6000 | 6.2 | C | 2.0 | B |
| Example 8 | 2 | 5 | 6000 | 4.1 | A | 1.6 | A |
| Example 9 | 5 | 5 | 6000 | 4.4 | A | 1.5 | A |

As is clear from Table 1, the anisotropic graphite composites in Examples 1 to 9, which meet the conditions such that more than 1000 holes each having a diameter of not less than 0.1 μm and less than 20 μm and a depth of not less than 1 μm are formed per square millimeter, are more excellent in thermal conduction property and long-term reliability than the anisotropic graphite composites in Comparative Examples 1 to 3, which do not meet any of the conditions met by the anisotropic graphite composites in Examples 1 to 9. Note that Example 2 is shown twice in Table 1 for the sake of comparison.

For example, the comparison between Examples 1 to 4 and Comparative Examples 1 to 2 shows that the anisotropic graphite composite including the anisotropic graphite having holes the number of which is more than 1000 per square millimeter is excellent in long-term reliability. The comparison further shows that the number of the holes per square millimeter may be not less than 6000 in terms of long-term reliability.

The comparison between Examples 2 and 5 to 7 and Comparative Example 3 shows that the anisotropic graphite composite including the anisotropic graphite having holes of a diameter of not less than 0.1 μm and less than 20 μm is excellent in thermal conduction property. The comparison further shows that the diameter of the holes may be not less than 1 μm and less than 20 μm in terms of long-term reliability.

The comparison between Example 8 and Example 6 and the comparison between Example 2 and Example 9 show that the anisotropic graphite composites in which the holes are through holes more excellent in thermal conduction property and long-term reliability.

One or more embodiments of the present invention are suitably used in producing heat dissipating members for electronic devices.

REFERENCE SIGNS LIST 1 anisotropic graphite
11 graphite layer parallel to X-Z plane
12 hole
2 anisotropic graphite composite
21 anisotropic graphite
22 titanium-containing metal layer
23 inorganic material layer
3 anisotropic graphite composite
31 anisotropic graphite
32 titanium-containing metal layer
33 inorganic material layer
34 ceramic heater
35 water-cooling heat sink Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. Anisotropic graphite having, given an X axis, a Y axis orthogonal to the X axis, and a Z axis perpendicular to a plane defined by the X axis and the Y axis, a crystal orientation plane parallel to a plane defined by the X axis and the Z axis,
wherein, out of surfaces of the anisotropic graphite which are parallel to the plane defined by the X axis and the Y axis, at least one surface has more than 1000 holes per square millimeter formed therein, the holes each having a diameter of not less than 0.1 μm and less than 20 μm and a depth of not less than 1 μm.

2. The anisotropic graphite according to claim 1, wherein the anisotropic graphite has:
a length of a side parallel to the X axis of not less than 4 mm and not more than 300 mm;
a length of a side parallel to the Y axis of not less than 4 mm and not more than 300 mm; and
a thickness in a direction along the Z axis of not less than 0.5 mm and not more than 5.0 mm.

3. The anisotropic graphite according to claim 1, wherein, out of the surfaces of the anisotropic graphite which are parallel to the plane defined by the X axis and the Y axis, the at least one surface has more than 1000 holes per square millimeter formed therein, the holes each having a depth of not less than 1 mm.

4. The anisotropic graphite according to claim 1, wherein the holes are through holes.

5. The anisotropic graphite according to claim 1, wherein, out of the surfaces of the anisotropic graphite which are parallel to the plane defined by the X axis and the Y axis, the at least one surface has not less than 4000 holes per square millimeter formed therein, the holes each having a depth of not less than 1 μm.

6. The anisotropic graphite according to claim 1, wherein, out of the surfaces of the anisotropic graphite which are parallel to the plane defined by the X axis and the Y axis, the at least one surface has more than 1000 holes per square millimeter formed therein, the holes each having a diameter of not less than 2 μm and less than 20 μm.

7. An anisotropic graphite composite, comprising:
the anisotropic graphite according to claim 1;
a titanium-containing metal layer; and
an inorganic material layer,
the inorganic material layer being joined, via the titanium-containing metal layer, to at least one surface out of the surfaces of the anisotropic graphite which are parallel to the plane defined by the X axis and the Y axis.

* * * * *